United States Patent
Rouphael et al.

(10) Patent No.: US 11,658,643 B2
(45) Date of Patent: May 23, 2023

(54) CONFIGURABLE MULTIPLIER-FREE MULTIRATE FILTER

(71) Applicant: Raytheon Company, Waltham, MA (US)

(72) Inventors: Antoine Rouphael, Escondido, CA (US); Phillip Izdebski, Buena Park, CA (US); Allison Y. Pern, Monterey Park, CA (US); Joon S. Choi, Torrance, CA (US)

(73) Assignee: Raytheon Company, Waltham, MA (US)

( * ) Notice: Subject to any disclaimer, the term of this patent is extended or adjusted under 35 U.S.C. 154(b) by 209 days.

(21) Appl. No.: 17/151,395

(22) Filed: Jan. 18, 2021

(65) Prior Publication Data
US 2022/0231670 A1 Jul. 21, 2022

(51) Int. Cl.
*H03H 17/06* (2006.01)
*G01R 31/3193* (2006.01)
*H03H 17/02* (2006.01)

(52) U.S. Cl.
CPC ....... *H03H 17/06* (2013.01); *G01R 31/31937* (2013.01); *H03H 17/0223* (2013.01); *H03H 2017/0298* (2013.01)

(58) Field of Classification Search
CPC ........... G03H 17/06; G03H 2017/0232; G03H 2017/0239; H03H 17/06; H03H 17/0223; G01R 31/31937
See application file for complete search history.

(56) References Cited

U.S. PATENT DOCUMENTS

| | | | | |
|---|---|---|---|---|
| 5,262,974 A | * | 11/1993 | Hausman | G06F 7/4824 708/628 |
| 6,590,931 B1 | * | 7/2003 | Wittig | H03H 17/06 708/301 |
| 6,748,014 B1 | | 6/2004 | Kuo et al. | |

(Continued)

OTHER PUBLICATIONS

Sharma, et al. "Design of multiplierless prototype filter for two-channel filter bank using hybrid method in FCSD space", pp. 29-40. (Year: 2017).*

(Continued)

*Primary Examiner* — Tan V Mai
(74) *Attorney, Agent, or Firm* — Daly, Crowley, Mofford & Durkee, LLP

(57) ABSTRACT

A finite impulse response (FIR) filter including a delay line and a plurality of arithmetic units. Each arithmetic unit is coupled to a different one of a plurality of tap points of the delay line, is configured to receive a respective signal value over the delay line, and is associated with a respective coefficient. Any given one of the arithmetic units is configured to receive a respective control word. The respective control word specifying: (i) a plurality of trivial multiplication operations, and (ii) a plurality of bit shift operations. Any given one of the arithmetic units is further configured to estimate or calculate a product of the respective signal of the arithmetic unit respective signal value and the respective coefficient of the arithmetic unit by performing the trivial multiplication operations and bit shift operations that are specified by the respective control word that is received at the given arithmetic unit.

18 Claims, 12 Drawing Sheets

(56) References Cited

U.S. PATENT DOCUMENTS 7,257,609 B1 * 8/2007 Kosunen ............. G06F 9/30025
708/493

OTHER PUBLICATIONS

Chen et al. "A Low-Power Digit-Based Reconfigurable FIR Filter", IEEE Transactions on Circuits and Systems, Express Briefs, vol. 53, No. 8, Aug. 2006, 5 pages.
Pasko et al. "High-Performance Flexible All-Digital Quadrature Up and Down Converter Chip", IEEE, Journal of Solid-State Circuits, vol. 36. No. 3., Mar. 2001, 9 pages.
International Search Rereport and Written Opinion dated May 3, 2022 for PCT Application No. PCT/US2022/011943; 16 pages.

* cited by examiner

CONFIGURABLE MULTIPLIER-FREE MULTIRATE FILTER

BACKGROUND

Digital signal processing (DSP) is the processing of digitized discrete time time-sampled signals. Digital signal processing and its advancement have dramatically expanded various fields of technology, such as electronics and telecommunications. For example, digital signal processing is routinely used in technologies, such as satellite communications, digital cameras, cellular telephones, digital and satellite television, medical instruments, and geolocation. In many applications, power-efficiency is an important factor that guides the selection of DSP circuits and techniques.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the disclosure.

According to aspects of the disclosure, a finite impulse response (FIR) filter is provided comprising: a delay line; a plurality of arithmetic units, each arithmetic unit being coupled to a different one of a plurality of tap points of the delay line, each of the arithmetic units being configured to receive a respective signal value over the delay line, each of the arithmetic units being associated with a respective coefficient; wherein any given one of the arithmetic units is configured to receive a respective control word, the respective control word specifying: (i) a plurality of trivial multiplication operations, and (ii) a plurality of bit shift operations, and wherein any given one of the arithmetic units is configured to estimate or calculate a product of the respective signal value of the arithmetic unit and the respective coefficient of the arithmetic unit by performing the trivial multiplication operations and bit shift operations that are specified by the respective control word that is received at the given arithmetic unit.

According to aspects of the disclosure, a system is provided comprising: a finite impulse response (FIR) filter including a delay line and a plurality of arithmetic units; a controller that is operatively coupled to the FIR filter, the controller being arranged to perform the operations of: select a signal; identify a control word set that is associated with the signal, each of the control words in the control word set specifying: (i) a respective plurality of trivial multiplication operations, and (ii) a respective plurality of bit shift operations; and configure the FIR filter based on the control word set, wherein configuring the FIR filter based on the control word set includes applying the control word set to the FIR filter.

According to aspects of the disclosure, a method is provided, comprising: selecting a signal; identifying a control word set that is associated with the signal, each of the control words in the control word set specifying: (i) a respective plurality of trivial multiplication operations, and (ii) a respective plurality of bit shift operations; and configuring a finite impulse response (FIR) filter based on the control word set, wherein configuring the FIR filter based on the control word set includes applying the control word set to the FIR filter.

BRIEF DESCRIPTION OF THE DRAWING FIGURES

Other aspects, features, and advantages of the claimed disclosure will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
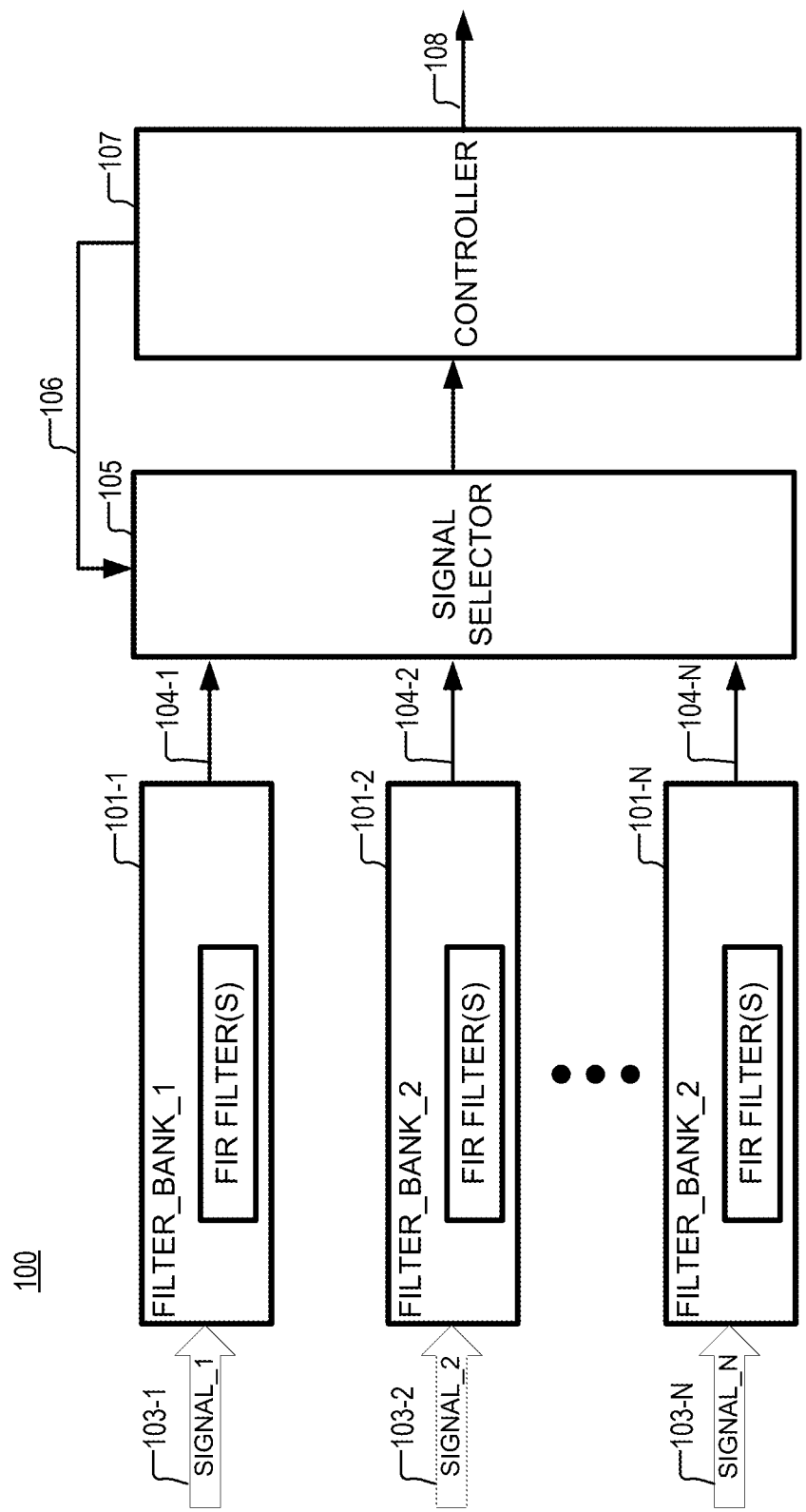
FIG. 1 is a diagram of an example of a system, according to the prior art.

FIG. 1 is a diagram of an example of a signal processing system 100, according to the prior art. As illustrated, the signal processing system 100 may include N filter banks 101 (in order to provide a plurality of filtered signals at various data rates), a signal selector 105, and a controller 107, where N is a positive integer greater than two. Each of the filter banks 101 may include a set of one or more Finite Impulse Response (FIR) filters. In operation, filter bank 101-1 may be configured to receive a signal 103-1, filter the signal 103-1 to produce a signal 104-1, and provide the signal 104-1 to the signal selector 105. Filter bank 101-2 may be configured to receive a signal 103-2, filter the signal 103-2 to produce a signal 104-2, and provide the signal 104-2 to the signal selector 105. And filter bank 101-N may be configured to receive a signal 103-N, filter the signal 103-N to produce a signal 104-N, and provide the signal 104-N to the signal selector 105. The signal selector 105 may be configured to select one of the signals 104, based on a control signal 106, and provide the selected signal 104 to the controller 107. The controller 107 may process the selected signal 104 to generate an output signal 108, which is subsequently output by the controller 107.

The signals 103 may differ from one another in at least one signal characteristic such as frequency, sampling rate, signal envelope, bandwidth, etc. Each filter bank 101 may have a response that is specifically tailored to the filter bank's 101 corresponding signal 103. For example, the filter bank 101-1 may have a response that is specifically tailored to the signal 103-1, the filter bank 101-2 may have a response that is specifically tailored to the signal 103-2, and the filter bank 101-N may have a response that is specifically tailored to the signal 103-N. As can be readily appreciated, having a different filter bank (or signal path) for each type of signal is inefficient because it may result in increased power consumption.

Figure 2A:
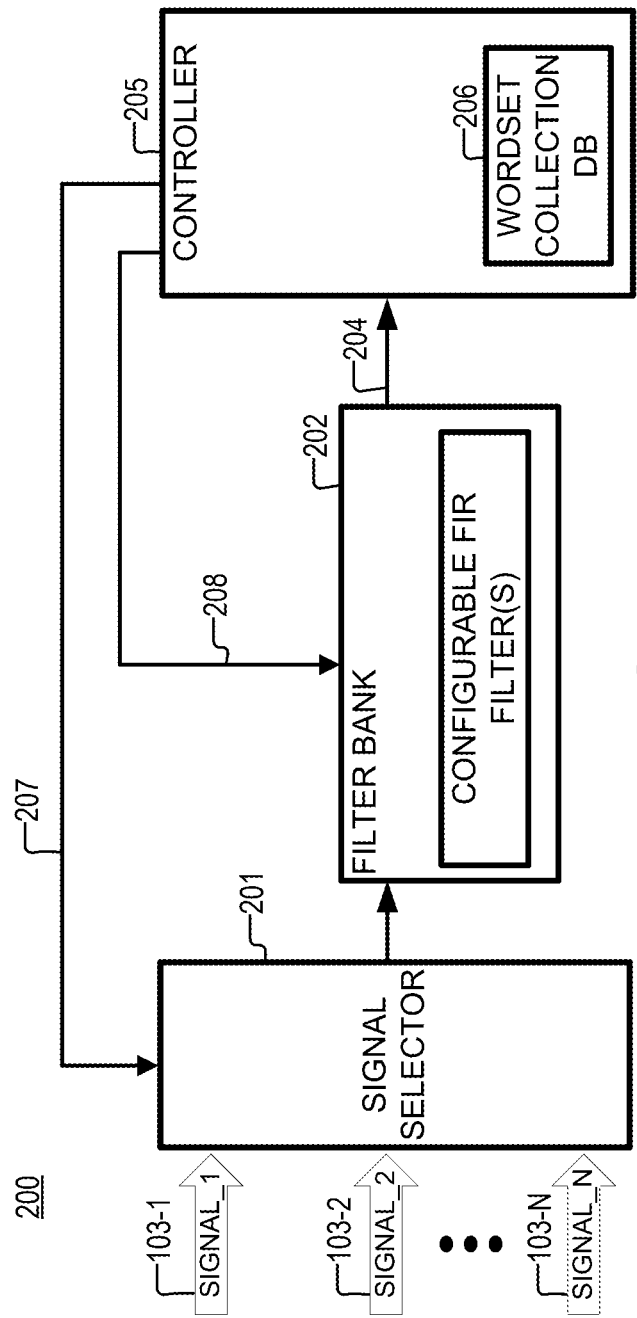
FIG. 2A is a diagram of an example of a system, according to the present disclosure.

FIG. 2A is a diagram of an example of a signal processing system 200, according to aspects of the disclosure. As illustrated, the signal processing system 200 may include a signal selector 201, a filter bank 202, and a controller 205. The signal selector 201 may be configured to receive the signals 103, select one of the signals 103 based on a signal 207 that is provided by the controller 205, and forward the selected signal 103 to the filter bank 202. The filter bank 202 may include one or more configurable FIR filters, such as a configurable FIR filter 300 (shown in FIG. 3). The filter bank 202 may process the selected signal 103, with the configurable FIR filters, to produce a filtered signal 204. The filter bank 202 may provide the signal 204 to the controller 205. The controller 205 may process the signal 204 to generate an output signal based on the signal 204.

Because the filter bank 202 includes configurable FIR filters, the filter bank 202 may have a response that is configurable by the controller 205. In operation, the controller may retrieve a word set collection 208 from a database 206. The controller 205 may then impart a desired response on the filter bank 202 by applying the retrieved word set collection 208 to the filter bank 202. For example, when a first word set collection is applied to the filter bank 202, the filter bank 202 may come to have a response that is usable for processing the signal 103-1. When a second word set collection is applied to the filter bank 202, the filter bank 202 may come to have a response that is usable for processing the signal 103-2. And when an N-th word set collection is applied to the filter bank 202, the filter bank 202 may come to have a response that is usable for processing the signal 103-N.

According to the present disclosure, a word set collection may include a plurality of word sets. Each word set may include one or more control words. A discussion of word sets and control words is provided further below with respect to FIGS. 3-9. As used throughout the disclosure, the phrase "applying a word collection to a filter bank" shall refer to providing one or more signals to the filter bank 202 that represent a particular word set collection and/or taking any other action that causes FIR filters in the filter bank to perform the operations that are specified by words in the word set collection.

In some implementations, the signal processing system 200 may have a lower power consumption than the system 100. As noted above, the system 100 may use a different filter bank to process each of a plurality of signals 103, which results in increased power consumption. By contrast, the signal processing system 200 may dynamically configure the response of the filter bank (by applying a selected word set collection to the filter bank 202), which may permit the signal processing system 200 to use the filter bank 202 alone to process each and any of the plurality of signals 103.

Figure 2B:
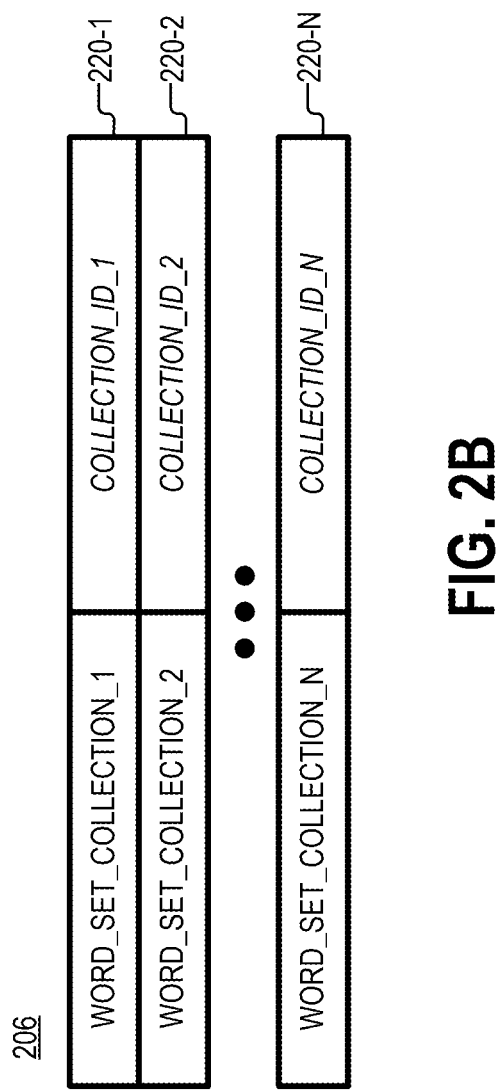
FIG. 2B is a diagram of a word set collection database, according to the present disclosure.

FIG. 2B is a diagram of the database 206, according to aspects of the disclosure. As illustrated, the database 206 may include N entries 220. Each of the entries 220 may map a different word set collection to a respective collection identifier. A collection identifier may include a filter bank response identifier, a signal identifier, and/or any other suitable type of identifier. For example, a collection identifier may include any suitable number, string, or alphanumerical string that identifies a particular filter bank response. As another example, a collection set identifier may include any suitable number, string, or alphanumerical string that identifies a particular signal characteristic. The signal characteristic may include a signal name (e.g., as specified by a standard's specification), a frequency, a bandwidth, a data rate, etc. As can be readily appreciated, the database 206 may be used by the controller 205 to identify the word set collection that is needed by the filter bank 202 to process a particular signal.

Figure 3:
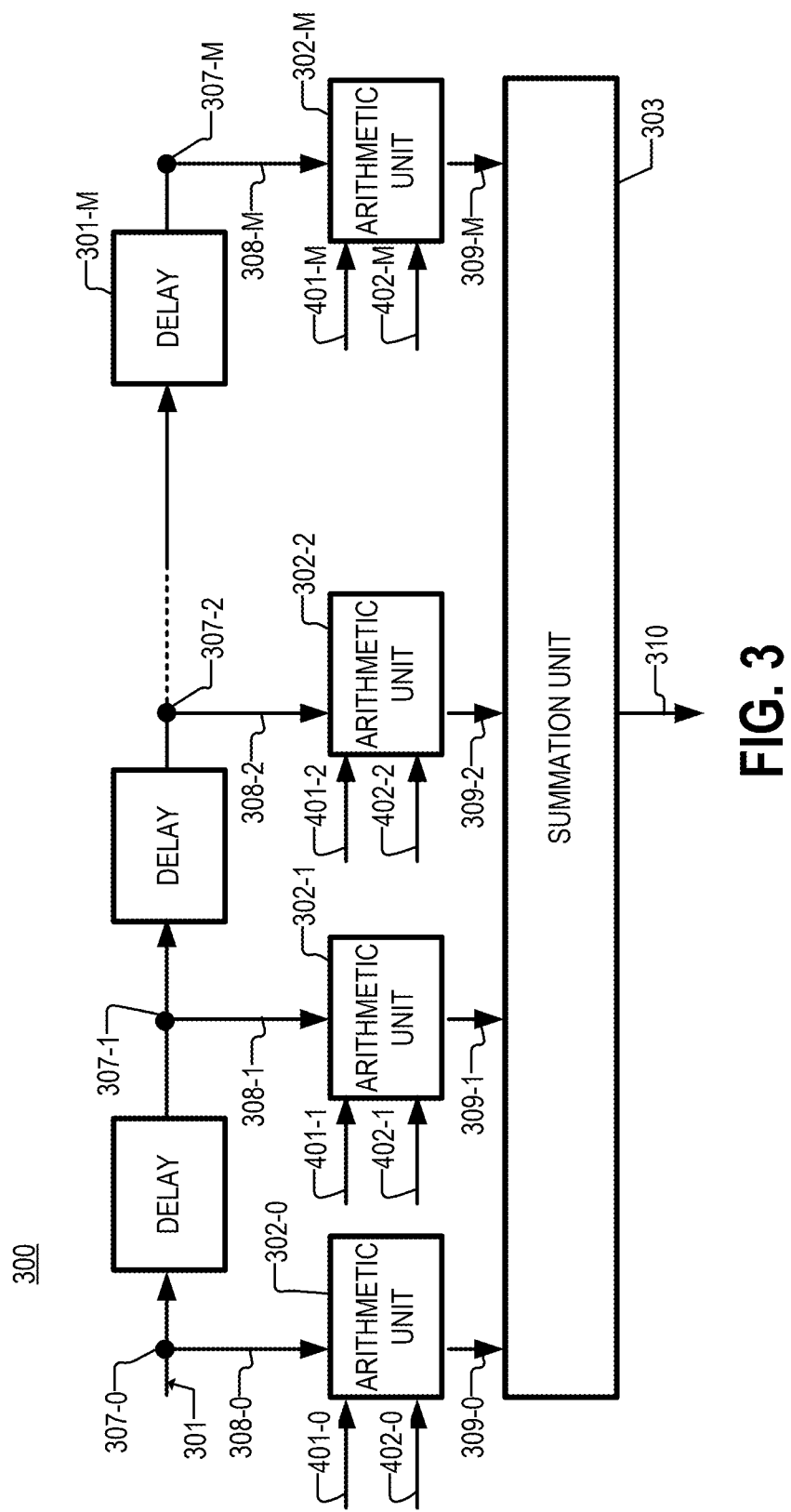
FIG. 3 is a diagram of an example of a finite impulse response (FIR) filter, according to the present disclosure.

FIG. 3 is a schematic diagram of an example of a configurable FIR filter 300, according to aspects of the disclosure. As illustrated, the FIR filter 300 may include a delay line 301, M arithmetic units 302, and a summation unit 303, wherein M is any positive integer. The delay line may include a plurality of tap points 307. Each of the arithmetic units 302 may be coupled to the delay line 301 at a different one of the tap points 307. Each of the arithmetic units 302 may receive a respective signal value 308 over the delay line 301. Each of the arithmetic units 302 may be configured to generate an output value 309 based on the received signal value 308, and provide the generated output value 309 to the summation unit 303. The summation unit 303 may sum all received output values 309 to produce an output value 310.

The operation performed by any given one of the arithmetic units 302 may be described by Equation 1 below:

$$OV_{309\text{-}i} = k_i SV_{308\text{-}i} \qquad (1)$$

where, i is an index of the given arithmetic unit 302, $SV_{308\text{-}i}$ is the signal value 308-i that is received at arithmetic unit 302-i, $OV_{309\text{-}i}$ is the output value 309-i that is output by the arithmetic unit 302-i, and $k_i$ is a coefficient (e.g., a FIR filter coefficient) that corresponds to the arithmetic unit 302-i. In some implementations, each arithmetic unit 302 may be associated with a different coefficient k.

Each arithmetic unit 302 may perform (and/or estimate) the calculation described by Equation 1 by executing a series of trivial multiplication and bit shift operations. Trivial multiplication of a signal value, according to the present disclosure, may include multiplying the signal value by a factor that is selected from the set of numbers consisting of {−1, 0, +1}. In some implementations, trivial multiplication can be accomplished by inverting one or more bits in the signal value and/or otherwise negating the signal value. In other words, trivial multiplication can be performed in a computationally and power-efficient manner. Similarly, bit shift operations can also be accomplished very efficiently (e.g., in a single clock cycle). In this regard, decomposing the multiplication operation (defined by Equation 1) into trivial multiplication and bit shift operations is advantageous because it can improve the power (and computational) efficiency of the FIR filter 300.

According to the present disclosure, each of the arithmetic units 302 is implemented in hardware. By way of example, in some implementations, each of the arithmetic units 302 may be implemented as a different electronic (e.g., digital) circuit or a different portion of the same electronic (e.g., digital) circuit. Although in the example of FIG. 3, the arithmetic units 302 are implemented in hardware alternative implementations are possible in which any of the arithmetic units 302 is implemented in hardware or as a combination of hardware and software.

In some implementations, the operation performed by the summation unit 303 may be described by Equation 2 below:

$$OV_{310} = \Sigma OV_{309-i} \quad (2)$$

where $OV_{310}$ is the output value 310 and $OV_{309-i}$, is the output value of the i-th arithmetic unit 302.

According to the example of FIG. 3, the arithmetic unit 302-0 may: receive the signal value 308-0, multiply the signal value 308-0 by a coefficient $k_0$ (not shown) to produce a output value 309-0, and provide the output value 309-0 to the summation unit 303. As noted above, the arithmetic unit 302-0 may calculate the product of the signal value 308-0 and the coefficient $k_0$ by performing a series of trivial multiplication operations and bit shift operations. The series of trivial multiplication operations are specified by a type-1 control word 401-0 that is applied to the arithmetic unit 302-0 (e.g., by a controller). The series of bit shift operations are specified by a type-2 control word 402-0 that is applied to the arithmetic unit 302-0 (e.g., by a controller). As used throughout the disclosure, the phrase "applying a control word to an arithmetic unit" shall refer to providing, to the arithmetic unit, a signal that represents the control word and/or taking any other action that causes the arithmetic unit to perform trivial multiplication and/or bit shift operations that are specified by the control word. In some implementations, the Canonical Signed Digit (CSD) representation may be used to represent any of the signal values 308, the output values 309, and the output value 310. In some implementations, each of the arithmetic units 302 may be configured to implement CSD arithmetic. Additionally or alternatively, in some implementations, each of the arithmetic units 302 may be have a programmable word size, rather than being limited to a fixed word size.

The arithmetic unit 302-1 may: receive the signal value 308-1, multiply the signal value 308-1 by a coefficient $k_1$ (not shown) to produce an output value 309-1, and provide the output value 309-1 to the summation unit 303. As noted above, the arithmetic unit 302-1 may calculate the product of the signal value 308-1 and the coefficient $k_1$ by performing a series of trivial multiplication operations and bit shift operations. The series of trivial multiplication operations are specified by a type-1 control word 401-1 that is applied to the arithmetic unit 302-1 (e.g., by a controller). The series of bit shift operations are specified by a type-2 control word 402-1 that is applied to the arithmetic unit 302-1 (e.g., by a controller).

The arithmetic unit 302-2 may: receive the signal value 308-2, multiply the signal value 308-2 by a coefficient $k_2$ (not shown) to produce an output value 309-2, and provide the output value 309-2 to the summation unit 303. As noted above, the arithmetic unit 302-2 may calculate the product of the signal value 308-2 and the coefficient $k_2$ by performing a series of trivial multiplication operations and bit shift operations. The series of trivial multiplication operations are specified by a type-2 control word 401-2 that is applied to the arithmetic unit 302-2 (e.g., by a controller). The series of bit shift operations are specified by a type-2 control word 402-2 that is applied to the arithmetic unit 302-2 (e.g., by a controller).

The arithmetic unit 302-M may: receive the signal value 308-M, multiply the signal value 308-M by a coefficient $k_M$ (not shown) to produce an output value 309-M, and provide the output value 309-M to the summation unit 303. As noted above, the arithmetic unit 302-M may calculate the product of the signal value 308-M and the coefficient $k_M$ by performing a series of trivial multiplication operations and bit shift operations. The series of trivial multiplication operations are specified by a type-1 control word 401-M that is applied to the arithmetic unit 302-M (e.g., by a controller). The series of bit shift operations are specified by a type-2 control word 402-M that is applied to the arithmetic unit 302-M (e.g., by a controller).

Figure 4:
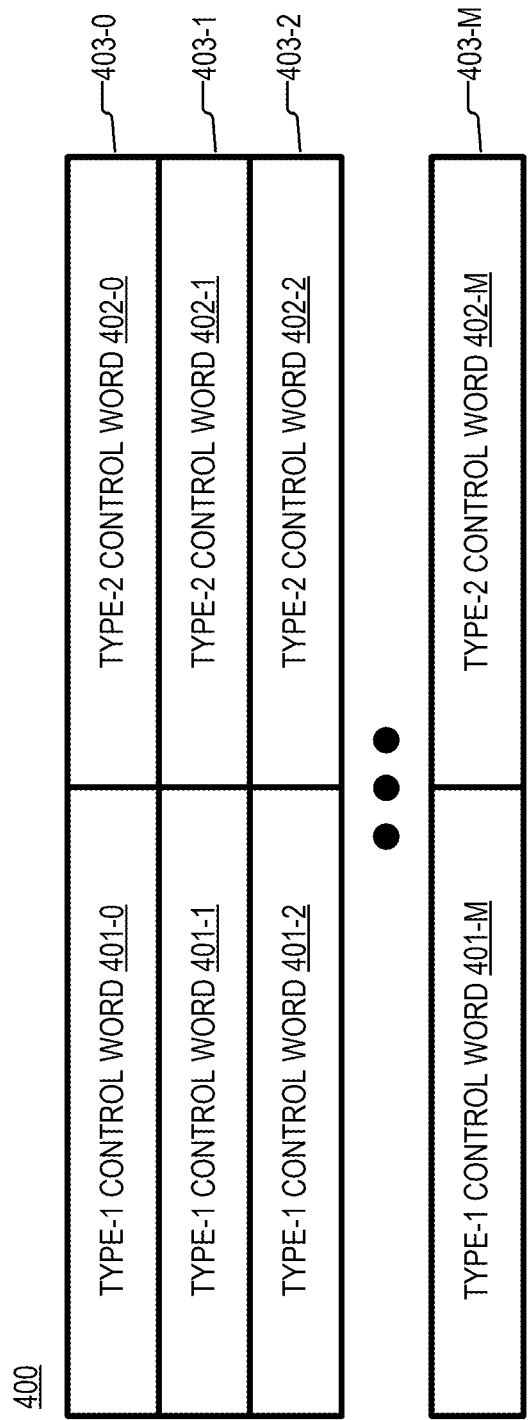
FIG. 4 is a diagram of an example of a word set for configuring the FIR filter of FIG. 3, according to the present disclosure.

As can be readily appreciated, the pair of type-1 and type-2 control words, which is applied to each of the arithmetic units 302, effectively encodes the coefficient k of that arithmetic unit (e.g., in terms of trivial multiplication and bit shift operations, etc). Specifically, control words 401-0 and 402-0 effectively encode the coefficient $k_0$; control words 401-1 and 402-1 effectively encode the coefficient $k_1$; control words 401-2 and 402-2 effectively encode the coefficient $k_2$; and control words 401-M and 402-M effectively encode the coefficient $k_M$;

FIG. 4 is a diagram of an example of a word set 400 for configuring the FIR filter 300, according to aspects of the disclosure. As noted above, the FIR filter 300 is configurable, and the response of the FIR filter 300 can be changed (by a controller) by applying a different word set to the FIR filter 300. For example, if one response is desired of the FIR filter 300, the controller may apply a first word set to the FIR filter 300. If a different response is desired of the FIR filter 300, the controller 107 may apply a different word set to the FIR filter 300. According to the present disclosure, a word set is a set of one or more control words. The one or more control words, as noted above, may effectively encode the coefficients of a FIR filter that is evaluated by using the hardware shown in FIG. 3.

The word set 400 may include a plurality of word pairs 403. Each word pair 403 may include a type-1 control word 401 and a type-2 control word 402. Each type-1 control word may specify a sequence of trivial multiplication operations that are to be performed (e.g., in parallel) by multiplication units that are part of a particular arithmetic unit 302. Each type-2 control word may specify a sequence of bit shift operations that are to be performed (e.g., in parallel) by shift registers (or other hardware) that are part of the particular arithmetic unit 302. In some implementations, the word set 400 may include a respective word pair for each arithmetic unit 302 that is part of FIR filter 300. Alternatively, in other implementations, the word set may include respective word pairs for fewer than all arithmetic units 302 in the FIR filter 300, and the FIR filter 300 may be configured to use fewer than all arithmetic units 302 when calculating the output value 310. In other words, the FIR filter 300 may be configured to evaluate a (logical) FIR filter that has: (i) the same number of coefficients as there are arithmetic units 302 or (ii) fewer coefficients than the number of arithmetic units 302 that are available in the FIR filter 300.

According to the example of FIG. 4, word pair 403-0 includes a type-1 control word 401-0 and a type-2 control word 402-0. Type-1 control word 401-0 specifies a plurality of trivial multiplication operations that are to be performed by arithmetic unit 302-0. Type-2 control word 402-0 specifies a plurality of bit shift operations that are to be performed by arithmetic unit 302-0. Word pair 403-1 includes a type-1 control word 401-1 and a type-2 control word 402-1. Type-1 control word 401-1 specifies a plurality of trivial multiplication operations that are to be performed by arithmetic unit 302-1. Type-2 control word 402-1 specifies a bit shift that are to be performed by arithmetic unit 302-1. Word pair 403-2 includes a type-1 control word 401-2 and a type-2 control word 402-2. Type-1 control word 401-2 specifies a plurality of trivial multiplication operations that are to be performed by arithmetic unit 302-2. Type-2 control word 402-2 specifies a plurality of bit shift operations that are to be performed by arithmetic unit 302-2. Word pair 403-M includes a type-1 control word 401-M and a type-2 control word 402-M. Type-1 control word 401-M specifies a plurality of trivial multiplication operations that are to be performed by arithmetic unit 302-M. Type-2 control word 402-M specifies a plurality of bit shift operations that are to be performed by arithmetic unit 302-M.

Figures 5, 6:
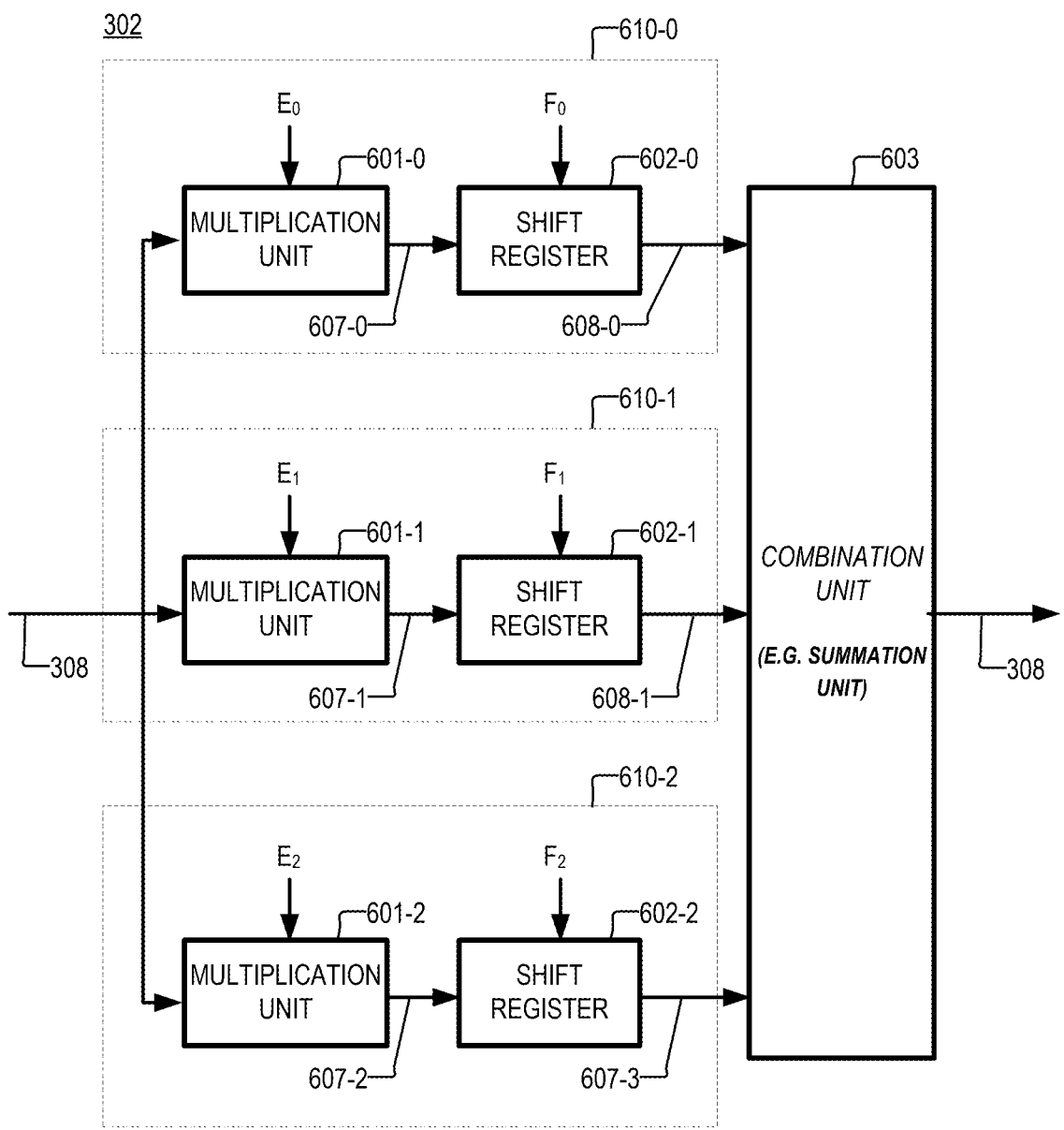
FIG. 5 is a diagram of an example of a control word for configuring an arithmetic unit that is part of the FIR filter of FIG. 3, according to the present disclosure.
FIG. 6 is a diagram of an example of an arithmetic unit that is part of the FIR filter of FIG. 3, according to the present disclosure.

FIG. 5 provides an example of a type-1 control word 401 and a type-2 control word 402. As the numbering suggests, the type-1 control word 401 may be the same or similar to any of the control words 401-0, 401-1, 401-2, and 401-M, which are discussed above with respect to FIGS. 3-4. The type-2 control word 402 may be the same or similar to any of the control words 402-0, 402-1, 402-2, and 402-M, which are discussed above with respect to FIGS. 3-4.

According to the example of FIG. 5, the type-1 control word 401 includes elements E0, E1, and E2. The type-2 control word, includes elements F0, F1, and F3. When the control words 401 and 402 are applied to the arithmetic unit 302 (shown in FIG. 6), they cause the arithmetic unit 302 to perform trivial multiplication and bit shift operations, which result in the calculation or estimation of the product of the signal value 308 and a coefficient k. In other words, the control words 401 and 402 implicitly specify the value of a particular coeffect k.

The term "control word" is used throughout the disclosure is not intended to imply any specific type of data formatting or organization. A control word, according to the present disclosure, may include any set of one or more control elements. A control element may be any suitable number, string, or alphanumerical string, which when applied (e.g., as a signal, etc) to a multiplication unit or shift register, causes the multiplication unit or shift register to perform a corresponding action. The term "control word" is not intended to imply any locational cohesion between the control elements. For example, the elements of a control word may be located in the same memory line or in different memory lines. Or put differently, the elements of a control word may be part of the same data frame or different data frames.

The term "word pair" refers to the data that is provided by the controller 107 to a particular arithmetic unit in order to cause the arithmetic unit to calculate (or estimate) the product of a signal value and a specific coeffect. In the example of FIGS. 2-6, control elements that control the operation of multiplication units are part of type-1 control words and control elements that control the operation of shift registers are part of type-2 control words. Under this nomenclature, a type-1 control word and a type-2 control word that controls the operation of a particular arithmetic unit form a word pair. However, it will be understood that alternative implementations are possible in which control elements that control the operation of the multiplication units (in a given arithmetic unit) and control elements that control the operation of the shift registers (in the same arithmetic unit) are part of the same control word. In this regard, it will be understood that the terms "word pair" and "control word" can be used interchangeably.

FIG. 6 provides an example of an arithmetic unit 302, according to aspects of the disclosure. As the numbering suggests, the arithmetic unit 302 may be the same or similar to any of the arithmetic units 302-0, 302-1, 302-3, and 302-M, which are discussed above with respect to FIG. 3. The arithmetic unit 302 is configured to receive a signal value 308 and generate an output value 309. As the numbering suggests, the signal value 308 may be the same or similar to any of the signal values 308-0, 308-1, 308-3, and 308-M, which are discussed above with respect to FIG. 3. As the numbering suggests, the output value 309 may be the same or similar to any of the output values 309-0, 309-1, 309-3, and 309-M, which are discussed above with respect to FIG. 3.

The arithmetic unit 302 may include a portion 610-0, a portion 610-1, a portion 610-2 and a combination unit 603. The combination unit 603 may include any suitable type of hardware for combining the respective outputs of the portions 610-0, 610-1, and 610-2. According to the example of FIG. 5, the combination unit 603 is a summation unit that is configured to generate an output value 609 by calculating the sum of a value 608-0, a value 608-1, and a value 608-2. As is discussed further below, the values 608-0, 608-1, and 608-2 are output from the portions 610-0, 610-1, and 610-2, respectively.

Portion 610-0 may include a multiplication unit 601-0 and a shift register 602-0. The multiplication unit 601-0 may generate a value 607-0 by performing trivial multiplication of the signal value 308. Performing trivial multiplication of the signal value 308 shall refer to multiplying the signal value 308 by a factor that is selected from the set of numbers consisting of $\{-1, -0, \text{ and } +1\}$. The factor may be selected based on a control element E0 that is received at the multiplication unit 601-0 from the controller 107. If the control element E0 has a first value, the multiplication unit 601-0 may multiply the signal value 308 by '−1'. If the control element E0 has a first value, the multiplication unit 601-0 may multiply the signal value 308 by '0'. If the control element E2 has a third value, the multiplication unit 601-0 may multiply the signal value 308 by '+1'. The shift register 602-0 may generate the signal 608-1 by performing a bit shift operation on the value 608-0. The shift register 602-0 may receive, from the controller 107, a control element F0, which specifies the offset of the shift operation. If the control element is equal to '5', for example, the shift register 602-0 may shift the value 607-0 by five places. Similarly, if the control element is equal to '7', for example, the shift register 602-0 may shift the value 607-0 by seven places, etc. In implementations in which the multiplication unit 601-0 implements CSD arithmetic, the multiplication by '−1' can be accomplished by negating the input word, and the multiplication by '+1' can be implemented as a pass-through operation. In other words, the trivial multiplication operation can be performed very efficiently (e.g., in one clock cycle) when CSD arithmetic used.

Portion 610-1 may include a multiplication unit 601-1 and a shift register 602-1. The multiplication unit 601-1 may generate a value 607-1 by performing trivial multiplication of the signal value 308. Performing trivial multiplication of the signal value 308 shall refer to multiplying the signal value 308 by a factor that is selected from the set of numbers consisting of $\{-1, 0, \text{ and } +1\}$. The factor may be selected based on a control element E1 that is received at the multiplication unit 601-1 from the controller 107. If the control element E1 has a first value, the multiplication unit 601-1 may multiply the signal value 308 by '−1'. If the control element E1 has a first value, the multiplication unit 601-1 may multiply the signal value 308 by '0'. If the control element E2 has a third value, the multiplication unit 601-1 may multiply the signal value 308 by '+1'. The shift register 602-1 may generate the signal 608-1 by performing a bit shift operation on the value 608-1. The shift register 602-1 may receive, from the controller 107, a control element F1, which specifies the offset of the shift operation. If the control element is equal to '5', for example, the shift register 602-1 may shift the value 607-1 by five places. Similarly, if the control element is equal to '7', for example, the shift register 602-1 may shift the value 607-1 by seven places, etc. In implementations in which the multiplication unit 601-1 implements CSD arithmetic, the multiplication by '−1' can be accomplished by negating the input word, and the multiplication by '+1' can be implemented as a pass-through operation. In other words, the trivial multiplication operation can be performed very efficiently (e.g., in one clock cycle) when CSD arithmetic used.

Portion 610-2 may include a multiplication unit 601-2 and a shift register 602-2. The multiplication unit 601-2 may generate a value 607-2 by performing trivial multiplication of the signal value 308. Performing trivial multiplication of the signal value 308 shall refer to multiplying the signal value 308 by a factor that is selected from the set of numbers consisting of {−1, 0, and +1}. The factor may be selected based on a control element E2 that is received at the multiplication unit 601-2 from the controller 107. If the control element E2 has a first value, the multiplication unit 601-2 may multiply the signal value 308 by '−1'. If the control element E2 has a first value, the multiplication unit 601-2 may multiply the signal value 308 by '0'. If the control element E2 has a third value, the multiplication unit 601-2 may multiply the signal value 308 by '+1'. The shift register 602-2 may generate the signal 608-1 by performing a bit shift operation on the value 608-2. The shift register 602-2 may receive, from the controller 107, a control element F2, which specifies the offset of the shift operation. If the control element is equal to '5', for example, the shift register 602-2 may shift the value 607-2 by five places. Similarly, if the control element is equal to '7', for example, the shift register 602-2 may shift the value 607-2 by seven places, etc. In implementations in which the multiplication unit 601-2 implements CSD arithmetic, the multiplication by '−1' can be accomplished by negating the input word, and the multiplication by '+1' can be implemented as a pass-through operation. In other words, the trivial multiplication operation can be performed very efficiently (e.g., in one clock cycle) when CSD arithmetic used.

The term "word set" may refer to the data that is provided by the controller 107 to a FIR filter, such as the FIR filter 300, in order to cause the FIR filter 300 to have a specific response. A word set may include a plurality of word pairs (or control words), wherein each word pair is used to configure a different arithmetic unit in the FIR filter 300. It will be understood that the present disclosure is not limited to any specific method for formatting or organizing a word set. The term "word set collection," as noted above, may refer to the data that is provided by the controller 107 in order to cause a particular configurable filter bank, such as the filter bank 202 (shown in FIG. 2) or the filter bank 1000 (shown in FIG. 10) to have a desired response. A word set collection may include a plurality of word sets, wherein each word set is used to configure a different FIR filter in the filter bank 202. It will be understood that the present disclosure is not limited to any specific method for formatting or organizing a word set collection.

Figure 7:
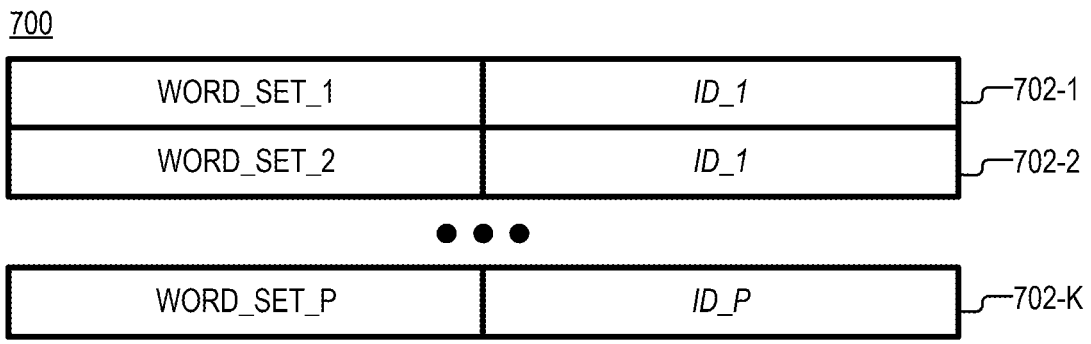
FIG. 7 is a diagram of an example of a word set database, according to aspects of the disclosure.

FIG. 7 is a diagram of an example of a word set database 700. As illustrated, the word set database 700 may include P entries 702, where P is any positive integer greater than 2. Each entry 702 may be arranged to map a different word set to a corresponding word set identifier. A word set identifier may include a filter response identifier, a signal identifier, and/or any other suitable type of identifier. For example, a word set identifier may include any suitable number, string, or alphanumerical string that identifies a particular filter response. As another example, a word set identifier may include any suitable number, string, or alphanumerical string that identifies a particular signal characteristic. The signal characteristic may include a signal name (e.g., as specified by a standard's specification), a frequency, a bandwidth, a data rate, etc. According to the example of FIG. 7, entry 702-1 may map a first word set to a first word set identifier; entry 702-2 may map a second word set to a second word set identifier; and entry 702-3 may map a P-th word set to a P-th word set identifier. As used throughout the disclosure, the term "database" may refer to one or more data structures and/or memory locations that are used to store information. In some implementations, the database 700 may be stored in the memory of a signal processing system 800, which is discussed further below with respect to FIG. 8.

Figure 8:
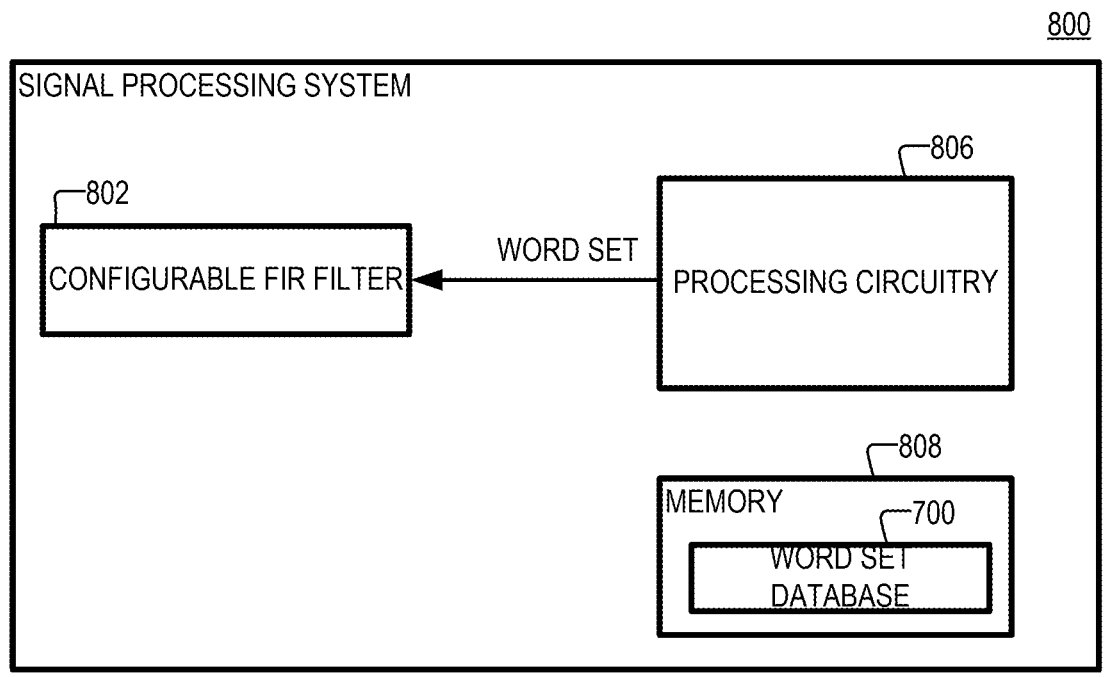
FIG. 8 is a diagram of an example of a signal processing system, according to aspects of the disclosure.

FIG. 8 is a diagram of an example of a system 800, according to aspects of the disclosure. The system 800 may be part of navigation equipment, radio equipment, communications equipment, and/or any other suitable type of signal processing equipment. The system 800 may include at least one configurable FIR filter 802 and a processing circuitry 806. The processing circuitry 806 may be arranged to configure the FIR filter 802 to have a specific response. Furthermore, the processing circuitry 806 may be configured to process signals that are generated, at least in part, by using the FIR filter 802. The FIR filter 802 may be the same or similar to the FIR filter 300, which is discussed above with respect to FIG. 3. The processing circuitry 806 may include one or more of an application-specific integrated circuit (ASIC), a general-purpose processor, a Field-Programmable Gate Array (FPGA), a digital signal processor (DSP), and/or any other suitable type of processing circuitry. In addition, the system may include a memory 808 that is configured to store the database 700. The memory 808 may include any suitable type of volatile and/or non-volatile memory. In some implementations, the memory 808 may include electrically erasable programmable read-only memory (EEPROM), a synchronous dynamic random-access memory (SDRAM), a network-attached storage (NAS) and/or any other suitable type of memory.

Figure 9:
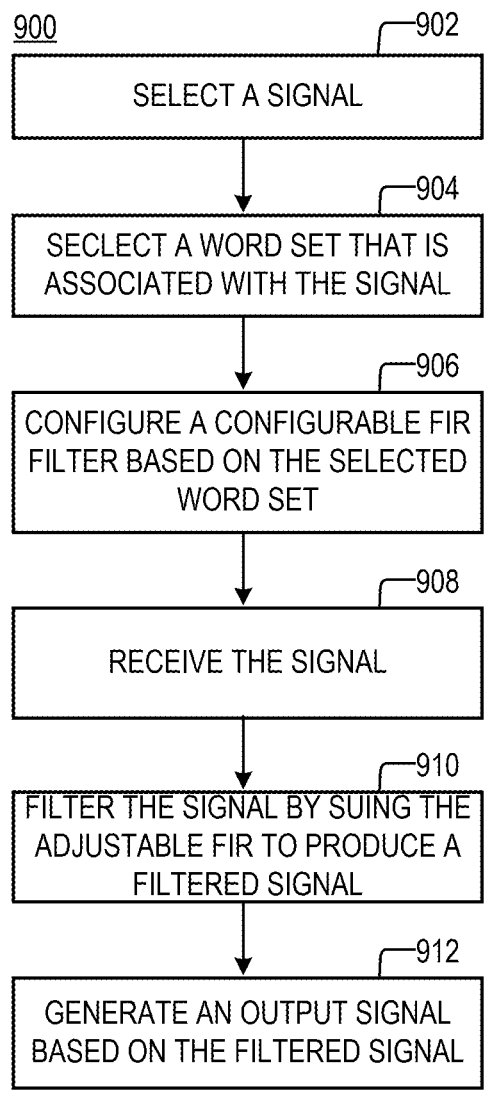
FIG. 9 is a flowchart of an example of a process, according to aspects of the disclosure.

FIG. 9 is a flowchart of an example of a process 900 that is performed by the system 800, according to aspects of the disclosure. At step 902, the processing circuitry 806 selects a signal. Selecting the signal may include retrieving from memory any suitable type of identifier that is associated with the signal. Such identifier may include a signal identifier associated with the signal, a response identifier associated with the signal, and/or any other suitable type of identifier. At step 904, the processing circuitry 806 selects a word set that is associated with the selected type of signal. Selecting the word set may include retrieving the word set from the database 700 based on an identifier that is obtained at step 902. At step 906, the processing circuitry 806 configures the FIR filter 802 to have desired signal response by applying the word set (retrieved at step 906) to the FIR filter 802. At step 908, the FIR filter receives the signal (selected at step 902). At step 910, the FIR filter filters the received signal to produce a filtered signal. And at step 912, the processing circuitry 806 processes the filtered signal to produce an output signal. The output signal may be provided to an external device or to one or more other components of the system 800, which are not shown in FIG. 8. It will be understood that the present disclosure is not limited to any specific method for processing the filtered signal.

Figure 10:
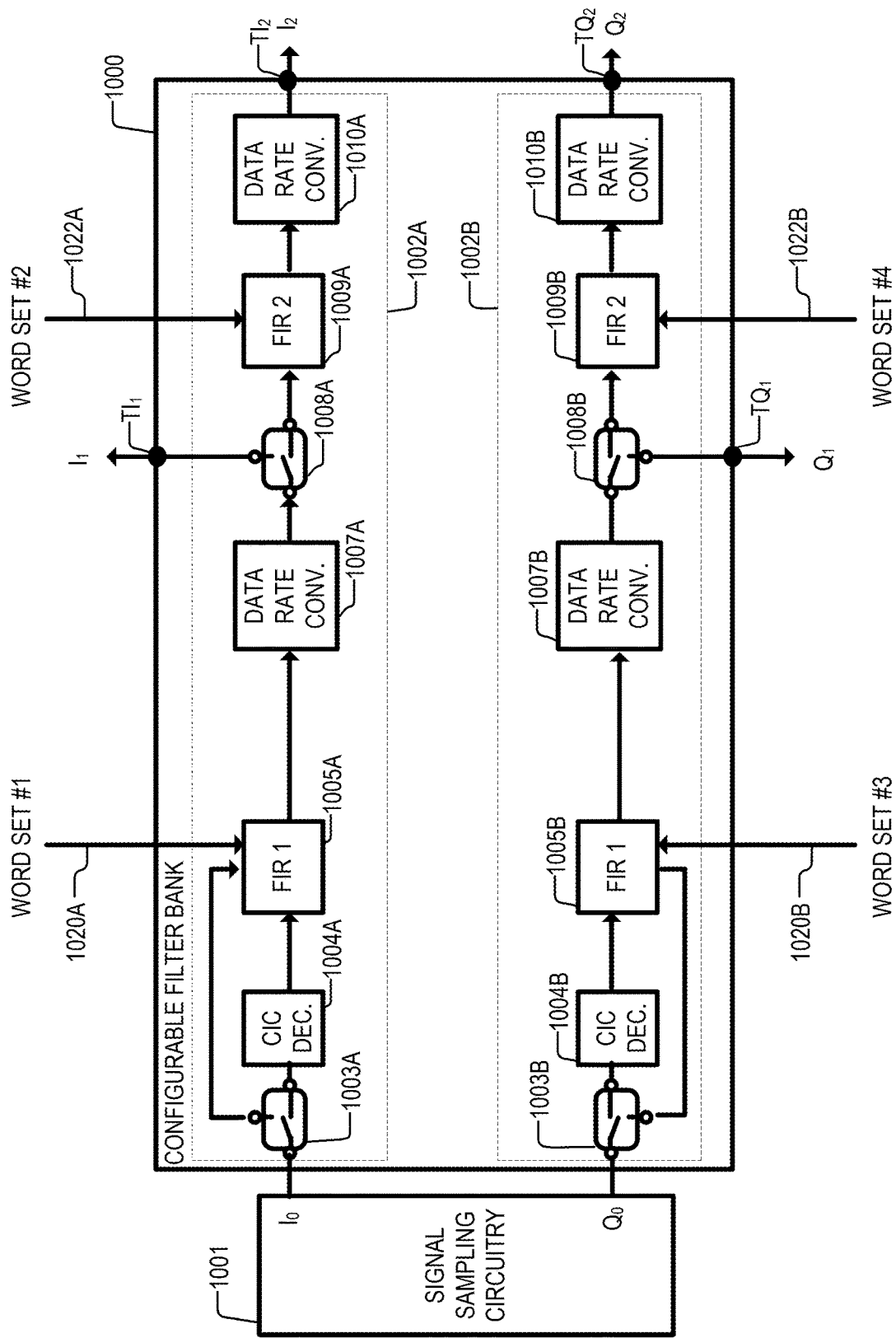
FIG. 10 is a diagram of an example of a filter bank, according to aspects of the disclosure.

FIG. 10 is a diagram of an example of a configurable filter bank 1000, according to aspects of the disclosure. The filter bank 1000 may be configured to receive a signal $I_0Q_0$ and change (e.g., reduce, etc.) the data rate of the signal $I_0Q_0$. The signal $I_0Q_0$ may include an in-phase component $I_0$ and a quadrature component $Q_0$. The signal $I_0Q_0$ may be generated by a signal sampling circuitry 1001. The data rate of the signal $I_0Q_0$ (hereinafter "original data rate") may be determined by the sampling frequency of the signal sampling circuitry 1001. The filter bank 1000 may be configured to reduce the original data rate of the signal $I_0Q_0$ to one of four possible data rates. Although in the present example the filter bank 1000 is arranged to reduce the original data rate of the signal $I_0Q_0$ to one of four possible data rates, it will be understood that alternative implementations are possible in which the filter bank is configured to reduce the original data rate of the is signal $I_0Q_0$ to one of a different number of data rates (e.g., to one of seven supported data rates, etc.)

Specifically, the filter bank 1000 may generate: (i) a signal $I_1Q_1$ that has one of a first data rate and a second data rate (depending on the state of switch 1003A) and (ii) a signal $I_2Q_2$ that has one of a third data rate and a fourth data rate (depending on the state of the switch 1003B). The original data rate, the first data rate, the second data rate, the third data rate, and the fourth data rate may be different from one another The filter bank 1000 may include a signal path 1002A and a signal path 1002B. The signal path 1002A may be arranged to process the in-phase component $I_0$ of the signal $I_0Q_0$ and the signal path 1002B may be arranged to process the quadrature component $Q_0$ of the signal $I_0Q_0$.

The signal path 1002A may include a switch 1003A, a cascaded integrator-comb (CIC) decimator 1004A, FIR filter 1005A, a data rate converter 1007A, a switch 1008A, a FIR filter 1009A, and a data rate converter 1010A. Each of the FIR filters 1005A and 1009A may be the same or similar to the FIR filter 300, which is discussed above with respect to FIG. 3. Although in the present example a CIC filter is used (as part of the decimator 1004A), it will be understood that alternative implementations are possible in which the CIC filter is replaced with another type filter, such as a FIR filter. The FIR filters 1005A and 1009A may be configured in accordance with word sets 1020A and 1022A, respectively, which are applied to the FIR filters 1005A and 1009A by a controller 1111 (shown in FIG. 11B). Each of the data rate converters 1007A and 1010A may be a down-sampler. Specifically, the data rate converter 1007A may be configured to remove every L-th sample of the signal (or data stream) that enters the data rate converter 1007A, where L is a positive integer. The data rate converter 1010A may be configured to remove every K-th sample the signal (or data stream) that enters the data rate converter 1010A, where K is a positive integer. The output of the data rate converter 1010A may be coupled to a terminal $TI_2$ of the filter bank 1000, and it may constitute the in-phase component $I_2$ of the signal $I_2Q_2$.

Each of the switches 1003A, and 1008A may include any suitable type of switching device. Each of the switches 1003A, and 1008A may be turned on and off by the controller 1111 (shown in FIG. 11B). The switch 1003A may be configured to bypass the CIC decimator 1004A when the controller 1111 wants the sampling circuitry 1001 to output the original signal $I_0$ to the FIR filter 1005A. The switch 1008A may be configured (by controller 1111) to route the output of the data rate converter 1007A to terminal $TI_1$ of the filter bank 1000 or to the FIR filter 1009A. The output of the data rate converter 1007A may constitute the in-phase component $I_1$ of the signal $I_1Q_1$.

In operation, the switch 1003A may provide the in-phase component $I_0$ of the signal $I_0Q_0$ to either the CIC decimator 1004A or the FIR filter 1005A. When it is not bypassed (by the switch 1003A), the CIC decimator 1004A may reduce the data rate of the in-phase component $I_0$ of the signal $I_0Q_0$, and provide its output to the FIR filter 1005A. The FIR filter 1005A may filter the signal that is generated by the CIC decimator 1004A (or received from the switch 1003A) and provide the filtered signal to the data rate converter 1007A. The data rate converter 1007 may down-sample the signal that is produced by the FIR filter 1005A and provide the down-sampled signal to the switch 1008A. The switch 1008A may route the down-sampled signal that is produced by the data rate converter 1007A to either terminal $TI_1$ of the filter bank 1000 or the FIR filter 1009A. The FIR filter 1009A may be configured to filter the down-sampled signal that is produced by the data rate converter 1007A and provide the filtered signal to the data rate converter 1010A. The data rate converter 1010A may down-sample the filtered signal (provided by the FIR filter 1009A) and output the down-sampled signal on terminal $TI_2$ of the filter bank 1000.

The signal path 1002B may include a switch 1003B, a cascaded integrator-comb (CIC) decimator 1004B, a FIR filter 1005B, a data rate converter 1007B, a switch 1008B, a FIR filter 1009B, and a data rate converter 1010B. Each of the FIR filters 1005B and 1009B may be the same or similar to the FIR filter 300, which is discussed above with respect to FIG. 3. Although in the present example a CIC filter is used (as part of the decimator 1004B), it will be understood that alternative implementations are possible in which the CIC filter is replaced with another type filter, such as a FIR filter. The FIR filters 1005B and 1009B may be configured in accordance with word sets 1020B and 1022B, respectively, which are applied to the FIR filters 1005B and 1009B by the controller 1111. Each of the data rate converters 1007B and 1010B may be a down-sampler. Specifically, the data rate converter 1007B may be configured to remove every L-th sample of the signal (or data stream) that enters the data rate converter 1007B. The data rate converter 1010B may be configured to remove every K-th sample the signal (or data stream) that enters the data rate converter 1010A. The output of the data rate converter 1010B may be coupled to a terminal $TQ_2$ of the filter bank 1000, and it may constitute the quadrature component $Q_2$ of the signal $I_2Q_2$.

Each of the switches 1003B, and 1008B may include any suitable type of switching device. Each of the switches 1003B, and 1008B may be turned on and off by a controller 1111 (shown in FIG. 11B). The switch 1003B may be configured to bypass the CIC decimator 1004B when the controller 1111 wants the signal sampling circuitry 1001 to output the original signal $Q_0$ to the FIR filter 1005B. The switch 1008B may be configured (by controller 1111) to route the output of the data rate converter 1007B to terminal $TQ_1$ of the filter bank 1000 or to the FIR filter 1009B. The output of the data rate converter 1007B may constitute the quadrature component $Q_1$ of the signal $I_1Q_1$.

In operation, the switch 1003B may provide the quadrature component $Q_0$ of the signal $I_0Q_0$ to either the CIC decimator 1004B or the FIR filter 1005B. When it is not bypassed (by the switch 1003B), the CIC decimator 1004B may reduce the data rate of the quadrature component $Q_0$ of the signal $I_0Q_0$, and provide its output to the FIR filter 1005B. The FIR filter 1005B may filter the signal that is generated by the CIC decimator 1004B (or received from the switch 1003B) and provide the filtered signal to the data rate converter 1007B. The data rate converter 1007B may down-sample the signal that is produced by the FIR filter 1005B and provide the down-sampled signal to the switch 1008B. The switch 1008B may route the down-sampled signal that is produced by the data rate converter 1007B to either terminal $TQ_1$ of the filter bank 1000 or the FIR filter 1009B. The FIR filter 1009B may be configured to filter the down-sampled signal that is produced by the data rate converter 1007B and provide the filtered signal to the data rate converter 1010B. The data rate converter 1010B may down-sample the filtered signal (provided by the FIR filter 1009B) and output the down-sampled signal on terminal $TQ_2$ of the filter bank 1000.

FIG. 10 is provided for illustrative purposes only. Although the data rate converter 1007A is depicted as separate of the FIR filter 1005A, alternative implementations are possible in which the data rate converter 1007A is integrated into the FIR filter 1005A. Although the data rate converter 1010A is depicted as separate of the FIR filter 1009A, alternative implementations are possible in which the data rate converter 1010A is integrated into the FIR filter 1009A. Although the data rate converter 1007B is depicted as separate of the FIR filter 1005B, alternative implementations are possible in which the data rate converter 1007B is integrated into the FIR filter 1005B. Although the data rate converter 1010B is depicted as separate of the FIR filter 1009B, alternative implementations are possible in which the data rate converter 1010B is integrated into the FIR filter 1009B.

Although in the example of FIG. 10, the filter bank 1000 is configured to reduce the data rate of the signal $I_0Q_0$ alternative implementations are possible in which the filter bank 1000 is configured to increase the data rate of the signal $I_0Q_0$. In such implementations, any of the data rate converters 1007A, 1010A, 1007B, and 1010B may be an interpolator instead of a down-sampler.

Figure 11A:
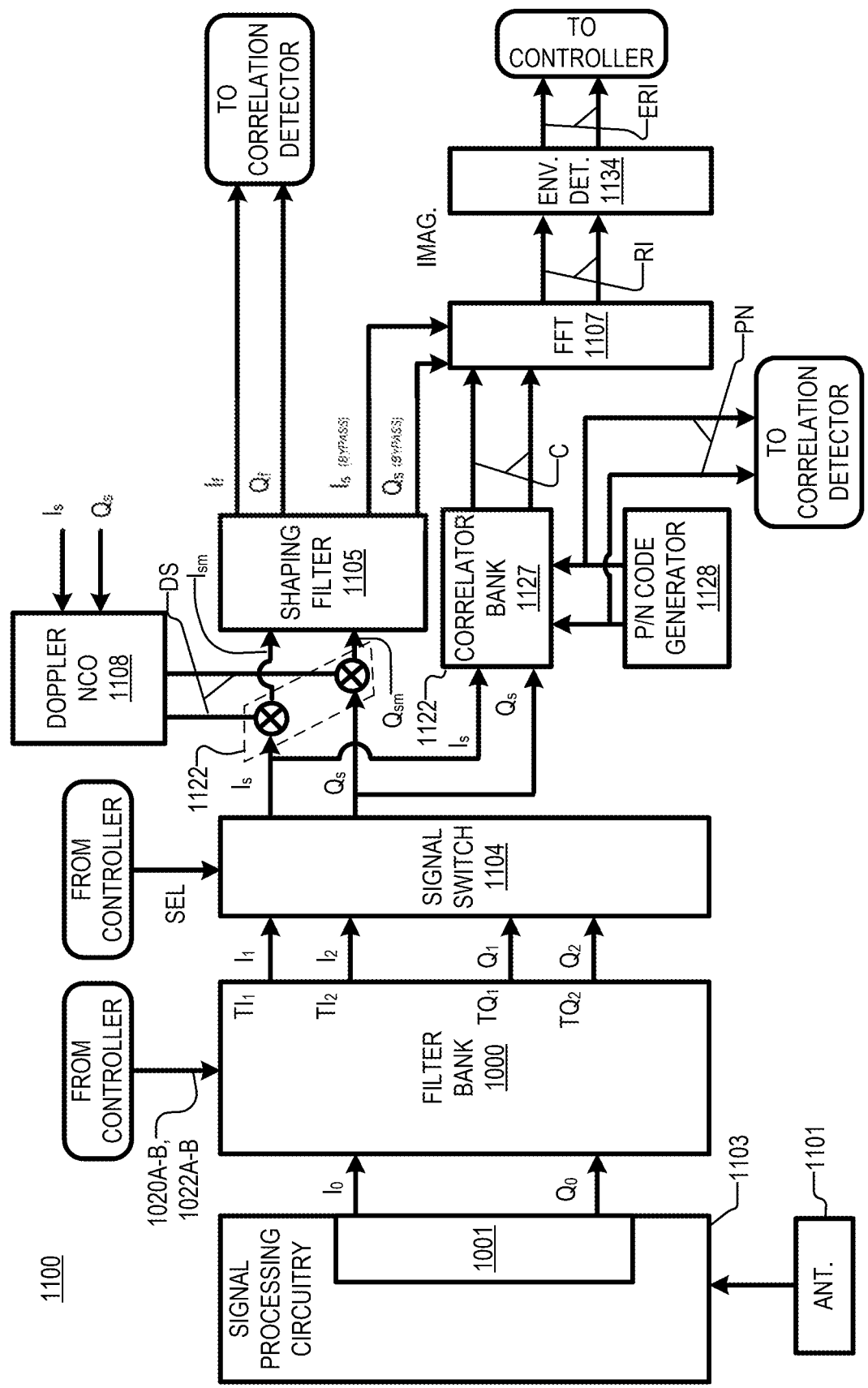
FIG. 11A is a diagram of an example of a system, according to aspects of the disclosure.
Figure 11B:
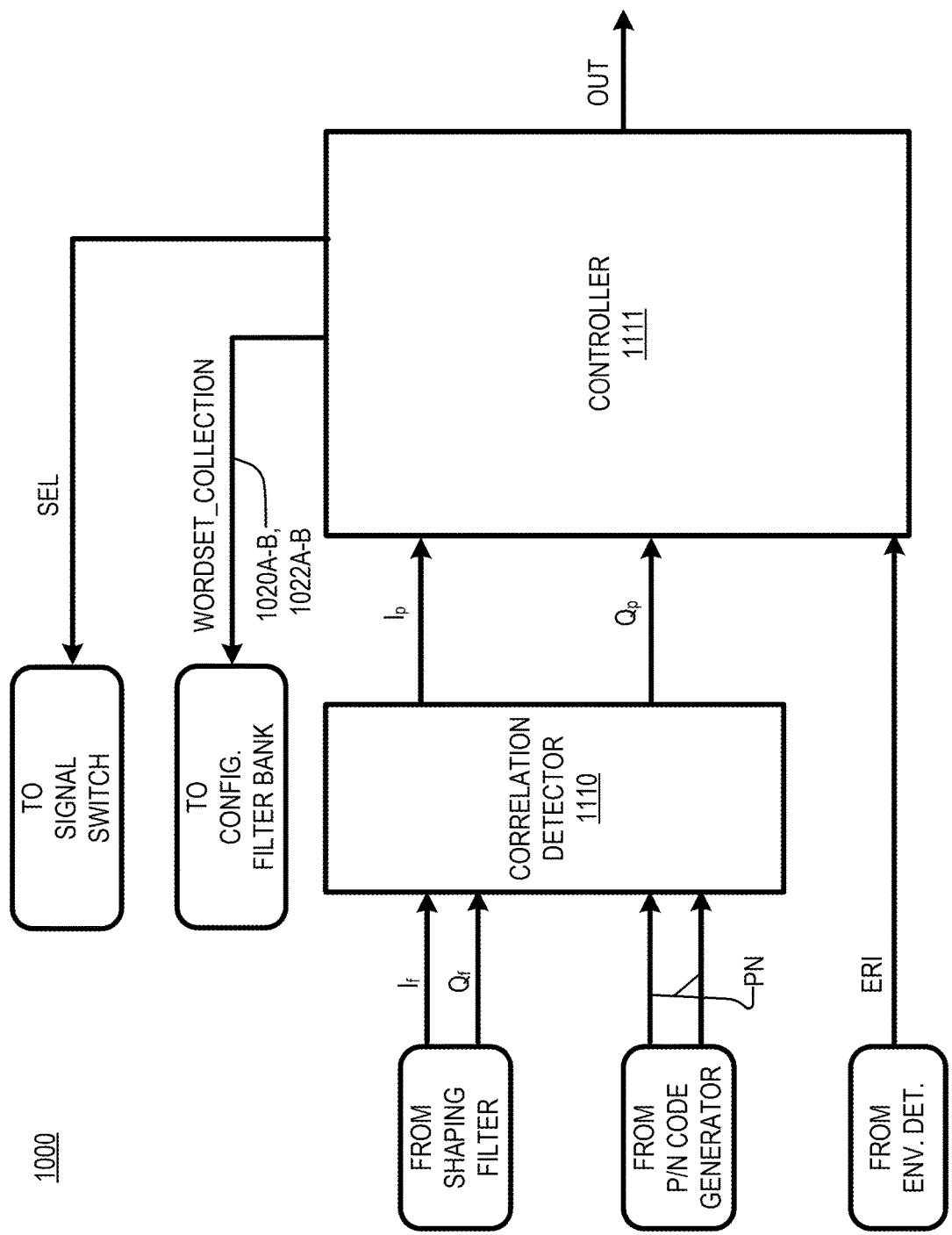
FIG. 11B is a diagram of an example of a system, according to aspects of the disclosure.

FIGS. 11A-B depict an example of a system 1100, which may use the filter bank 1000 of FIG. 10. The system 1100 may include one or more antennas 1101, a signal processing circuitry 1103, the filter bank 1000, a signal switch 1104, a shaping filter 1105, a correlator bank 1127, a pseudo noise (P/N) code generator 1128, a Fast Fourier Transform (FFT) unit 1107, a Doppler numerical control oscillator (NCO) 1108, modulators 1122, an envelope detector 1134, a correlation detector 1110, and a controller 1111.

The antenna 1101 may include one or more antennas that are configured to receive geolocational signals. In some implementations, the antenna 1101 may receive signals from several geolocation providers, such as a geosynchronous equatorial orbit (GEO) satellite navigation system, a low-earth orbit (LEO) satellite navigation system, GPS, GALILEO, IRNSS, etc.

The signal processing circuitry 1103 may include any suitable type of circuitry for processing a signal that is received by the antenna 1101. In some implementations, the signal processing circuitry 1103 may include an automatic gain control circuit, one or more high-pass filters, a signal modulator, and/or any other suitable type of processing circuitry. The signal processing circuitry 1103 may also include the signal sampling circuitry 1001. As noted above with respect to FIG. 10, the signal sampling circuitry 1001 may generate the signal $I_0Q_0$ and provide the signal $I_0Q_0$ to the filter bank 1000. The signal switch 1104 may be coupled to terminals $TI_1$, $TI_2$, $TQ_1$, and $TQ_2$ of the filter bank 1000. The signal switch 1104 may route one of the signals $I_1Q_1$ and $I_2Q_2$, which are received over terminals $TI_1$, $TI_2$, $TQ_1$, and $TQ_2$, to the modulators 1122, the Doppler NCO 1108, and the correlator bank 1127. Specifically, the signal switch 1104 may output a signal $I_sQ_s$ to the modulators 122, the Doppler NCO 1108, and the correlator bank 1127. As noted above, the signal $I_sQ_s$ may be the same as one of signals $I_1Q_1$ and $I_2Q_2$ that are output by the filter bank 1000. The routing may be performed based on a selection signal SEL that is received at the signal switch 1104 from the controller 1111 (shown in FIG. 11B).

The Doppler NCO 1108 may estimate the Doppler shift of the signal $I_sQ_s$ and generate a signal DS that is indicative of the Doppler shift. Modulators 1122 may multiply the signal $I_sQ_s$ by the signal DS to produce a signal $I_{sm}Q_{sm}$, which is subsequently provided to the shaping filter 1105. The shaping filter 1105 may filter the signal $I_{sm}Q_{sm}$ to produce a filtered signal $I_fQ_f$, which is subsequently provided to the correlation detector 1110.

The pseudo-noise (P/N) code generator 1128 may provide a signal PN (which represents a P/N code sequence) to the correlator bank 1127 and the correlation detector 1110. The correlator bank 1127 may receive the signals $I_sQ_s$ and PN and generate a signal C, which is subsequently provided to the FFT unit 1107. The correlator bank may correlate the signal $I_sQ_s$ with the PN code and set the signal C to a logic-high value when both the reference PN code and incoming signal are lined-up in code-phase. The FFT unit 1107 may receive the signal $I_sQ_s$ (as a bypass signal from the shaping filter 1105) and the signal C, and it may generate a signal RI, which represents the real and imaginary numbers of the discrete Fourier transform of the signal $I_sQ_s$. The envelope detector 1134 may generate a signal ERI, which represents the real and imaginary numbers of the envelope of the signal RI, and provide the signal ERI to the controller 1111. The correlation detector 1110 may receive the signals $I_fQ_f$ and PN and generate a signal $I_pQ_p$, which is subsequently provided to the controller 1111. In some implementations, before the signal $I_pQ_p$ is received at the controller 1111, further processing may be performed on the signal $I_pQ_p$. For example, the signal $I_pQ_p$ may be de-interleaved and filtered using a Viterbi filter. Furthermore, a CRC check and frame assembly operations may be performed on the signal $I_fQ_f$. The controller may process the signals $I_pQ_p$, and ERI in a well-known fashion, to generate an output signal OUT, which is subsequently output from the controller 1111. In some implementations, the signal OUT may be a signal that identifies one or more of positional coordinates of the system 1100, elevation of the system 1100, and time.

Figure 12:
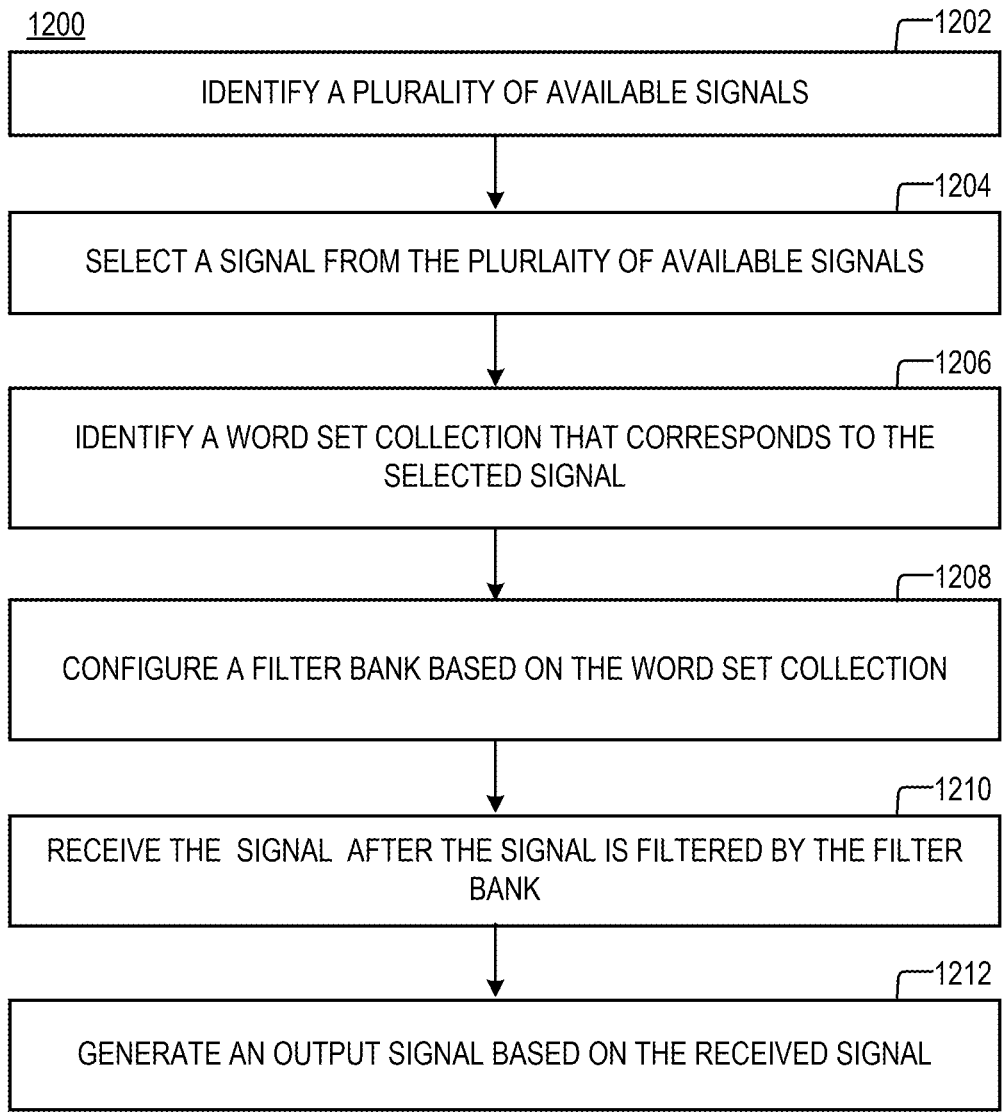
FIG. 12 is a flowchart of an example of a process, according to aspects of the disclosure.

FIG. 12 is a flowchart of an example of a process 1200, according to aspects of the disclosure. At step 1202, the controller 1111 identifies a plurality of available geolocation signals, which the system 1100 is capable of receiving. According to the example of FIG. 12, the controller detects that the system 1100 is capable of receiving a GPS signal, a GALILEO signal, and an IRSS signal. At step 1204, the controller 1111 selects one of the identified signals. According to the example of FIG. 12, the controller selects the GALILEO signal. At step, 1206, the controller 1111 identifies a word set collection that corresponds to the signal (selected at step 1204). The controller 1111 may identify the signal by performing a search of a word set collection database, such as the word set collection database 206, which is discussed above with respect to FIG. 2B. The word set collection database may be stored in the memory of the controller 1111 or at another location. The search may be performed based on an identifier corresponding to the signal (selected at step 1204). As a result of the search, the controller 1111 may retrieve a word set collection that includes word sets 1020A, 1020B, 1022A, and 1022B, all of which are discussed above with respect to FIG. 10. At step 1208, the controller 1111 configures the filter bank 1000 based on the word set collection (retrieved at step 1206). Configuring the filter bank 1000 based on the word set collection may include applying the word set collection (identified at step 1206) to the filter bank 1000. As noted above, applying the word set collection may include: (i) generating one or more signals based on the word set collection and providing the signals to the filter bank 1000 and/or (ii) taking any other action that causes the FIR filters 1005A-B and 1009A-B to perform the trivial multiplication and bit shift operations that are specified by the word set collection. Configuring the filter bank 1000 based on the word set collection may cause the filter bank to have a desired response that is suitable for processing the signal (selected at step 1204). Although not shown in FIG. 12, the controller 1111 may also configure the switches 1003A-B and 1008A-B (shown in FIG. 10) according to the signal (selected at step 1204). Although not shown in FIG. 12, the controller 1111 may also configure the signal switch 1104 (shown in FIG. 11A) according to the signal (selected at step 1204). At step 1210, the controller 1111 receives the signal, after the signal has been filtered by the filter bank 1000. According to the example of FIG. 12, the controller 1111 receives the signal $I_pQ_p$. At step 1212, the controller 1111 generates the output signal OUT based on the signal (received at step 1210). As noted above, the signal OUT may be generated in a well-known fashion, and it may identify one or more of positional coordinates of the system 1100, such as elevation of the system 1100, and time.

FIGS. 1-12 are provided as an example only. At least some of the steps discussed with respect to FIGS. 1-12 may be performed in parallel, in a different order, or altogether omitted. As used in this application, the word "exemplary" is used herein to mean serving as an example, instance, or illustration.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the disclosure and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed disclosure. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed disclosure. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed disclosure.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed disclosure might be made by those skilled in the art without departing from the scope of the following claims.

The invention claimed is:

1. A finite impulse response (FIR) filter including:
a delay line;
a plurality of arithmetic units, each arithmetic unit being coupled to a different one of a plurality of tap points of the delay line, each of the arithmetic units being configured to receive a respective signal value over the delay line, each of the arithmetic units being associated with a respective coefficient;
wherein any given one of the arithmetic units is configured to receive a respective control word, the respective control word specifying: (i) a plurality of trivial multiplication operations, and (ii) a plurality of bit shift operations,
wherein any given one of the arithmetic units is configured to estimate or calculate a product of the respective signal value of the arithmetic unit and the respective coefficient of the arithmetic unit by performing the trivial multiplication operations and bit shift operations that are specified by the respective control word that is received at the given arithmetic unit,
wherein the respective control word that is received by any given one of the arithmetic units specifies: (i) a receptive factor for each of the plurality of trivial multiplication operations that are specified by the respective control word, and (ii) a respective shift distance for each of the plurality of bit shift operations that are specified by the respective control word.

2. The FIR filter of claim 1, wherein the respective control word that is received at any given one of the arithmetic units encodes the respective coefficient that corresponds to the arithmetic unit.

3. The FIR filter of claim 1, wherein each of the plurality of trivial multiplication operations includes multiplying the given signal value of the respective arithmetic unit by a factor that is selected from the set of numbers consisting of $\{-1, 0, \text{ and } +1\}$.

4. The FIR filter of claim 1, wherein the given respective signal value of the arithmetic unit is represented by using the Canonical Signed Digit representation.

5. The FIR filter of claim 1, wherein the control word includes a type-1 control word and a type-2 control word.

6. The FIR filter of claim 1, wherein the respective control word of each of the plurality of arithmetic units is received from control circuitry that is operatively coupled to the FIR filter.

7. A system, comprising:
a finite impulse response (FIR) filter including a delay line and a plurality of arithmetic units;
a controller that is operatively coupled to the FIR filter, the controller being arranged to perform the operations of:
selecting a signal;
identifying a control word set that is associated with the signal, each of the control words in the control word set specifying: (i) a respective plurality of trivial multiplication operations, and (ii) a respective plurality of bit shift operations; and
configuring the FIR filter based on the control word set, wherein configuring the FIR filter based on the control word set includes applying the control word set to the FIR filter,
wherein each control word in the control word set specifies: (i) a receptive factor for each of the plurality of trivial multiplication operations that are specified by the control word, and (ii) a respective shift distance for each of the plurality of bit shift operations that are specified by the control word.

8. The system of claim 7, wherein:
the FIR filter includes: a delay line; and a plurality of arithmetic units, each arithmetic unit being coupled to a different one of a plurality of tap points of the delay line, each of the arithmetic units being configured to receive a respective signal value over the delay line, each of the arithmetic units being associated with a respective coefficient of the FIR filter,
wherein any given one of the arithmetic units is configured to receive a different control word from the control word set, and
wherein any given one of the arithmetic units is configured to estimate or calculate a product of the respective signal arithmetic unit and the respective coefficient of the arithmetic unit by performing the trivial multiplication operations and bit shift operations that are specified by the respective control word that is received at the given arithmetic unit.

9. The system of claim 7, wherein the FIR filter is part of a filter bank including one or more additional FIR filters and one or more data rate converters.

10. The system of claim 7, wherein each of the plurality of trivial multiplication operations includes multiplying the given respective signal value of the arithmetic unit by a factor that is selected from the set of numbers consisting of $\{-1, 0, \text{ and } +1\}$.

11. The system of claim 7, wherein each of the control words in the control word set encodes a different coefficient of the FIR filter.

12. The system of claim 7, wherein each of the control words in the control set includes a type-1 control word and a type-2 control signal.

13. A method, comprising:
selecting a signal;
identifying a control word set that is associated with the signal, each of the control words in the control word set specifying: (i) a respective plurality of trivial multiplication operations, and (ii) a respective plurality of bit shift operations; and
configuring a finite impulse response (FIR) filter based on the control word set, wherein configuring the FIR filter based on the control word set includes applying the control word set to the FIR filter,
wherein each control word in the control word set specifies: (i) a respective factor for each of the plurality of trivial multiplication operations that are specified by the control word, and (ii) a respective shift distance for each of the plurality of bit shift operations that are specified by the control word.

14. The method of claim 13, wherein:
the FIR filter includes: a delay line; and a plurality of arithmetic units, each arithmetic unit being coupled to a different one of a plurality of tap points of the delay line, each of the arithmetic units being configured to receive a respective signal value over the delay line, each of the arithmetic units being associated with a respective coefficient of the FIR filter, wherein any given one of the arithmetic units is configured to receive a different control word from the control word set, and wherein any given one of the arithmetic units is configured to estimate or calculate a product of the respective signal value of the arithmetic unit and the respective coefficient of the arithmetic unit by performing the trivial multiplication operations and bit shift operations that are specified by the respective control word that is received at the given arithmetic unit.

15. The method of claim 13, wherein the FIR filter is part of a filter bank including one or more additional FIR filters and one or more data rate converters.

16. The method of claim 13, wherein each of the plurality of trivial multiplication operations includes multiplying the respective signal value of the arithmetic unit by a factor that is selected from the set of numbers consisting of $\{-1, 0, \text{ and } +1\}$.

17. The method of claim 13, wherein each of the control words in the control word set encodes a different coefficient of the FIR filter.

18. The method of claim 13, wherein each of the control words in the control set includes a type-1 control word and a type-2 control signal.

* * * * *